(12) United States Patent
Yamano et al.

(10) Patent No.: US 9,196,371 B2
(45) Date of Patent: Nov. 24, 2015

(54) NONVOLATILE SEMICONDUCTOR MEMORY DEVICE AND READ METHOD THEREOF

(71) Applicant: KABUSHIKI KAISHA TOSHIBA, Minato-ku (JP)

(72) Inventors: Ayako Yamano, Yokohama (JP); Norihiro Fujita, Yokohama (JP); Hitoshi Shiga, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 88 days.

(21) Appl. No.: 14/016,517

(22) Filed: Sep. 3, 2013

(65) Prior Publication Data

US 2014/0254261 A1 Sep. 11, 2014

(30) Foreign Application Priority Data

Mar. 8, 2013 (JP) ................. 2013-046070

(51) Int. Cl.
*G11C 29/00* (2006.01)
*G11C 16/26* (2006.01)
*G11C 16/04* (2006.01)
*G11C 16/20* (2006.01)

(52) U.S. Cl.
CPC ............ *G11C 16/26* (2013.01); *G11C 16/0483* (2013.01); *G11C 16/20* (2013.01); *G11C 29/82* (2013.01)

(58) Field of Classification Search
CPC ........ G11C 16/26; G11C 16/34; G11C 29/82; G11C 16/20; G11C 16/0483; G11C 16/02; G11C 16/06; G11C 29/42; G11C 16/00; G11C 11/5642; G11C 16/3418; G11C 16/349; G11C 16/3404; G11C 16/28; G11C 29/02; G11C 29/026; G11C 29/028; G11C 29/50016; G11C 11/56; G11C 2029/0409; G06F 13/00; G06F 12/0246; G06F 11/1068; G06F 11/26
See application file for complete search history.

(56) References Cited

U.S. PATENT DOCUMENTS

| | | |
|---|---|---|
| 6,643,180 B2 | 11/2003 | Ikehashi et al. |
| 6,751,122 B2 | 6/2004 | Kawai et al. |
| 7,738,302 B2 * | 6/2010 | Shibata et al. ........... 365/185.24 |
| 7,965,557 B2 | 6/2011 | Kang |

(Continued)

FOREIGN PATENT DOCUMENTS

| | | |
|---|---|---|
| JP | 2002-117699 | 4/2002 |
| JP | 2004-152413 | 5/2004 |

(Continued)

OTHER PUBLICATIONS

Office Action issued Aug. 4, 2015 in Japanese Patent Application No. 2013-046070 (with English language translation).

*Primary Examiner* — Guerrier Merant
(74) *Attorney, Agent, or Firm* — Oblon, McClelland, Maier & Neustadt, L.L.P.

(57) ABSTRACT

A nonvolatile semiconductor memory device includes a memory cell array and a control circuit. The memory cell array comprises a plurality of memory cells and stores initial setting data in the plurality of memory cells. The control circuit is configured to apply a first voltage to gates of the plurality of memory cells to read the initial setting data and, depending on that read result, apply a second voltage different from the first voltage to the gates of the plurality of memory cells to read the initial setting data.

17 Claims, 10 Drawing Sheets

(56) References Cited

U.S. PATENT DOCUMENTS

| | | |
|---|---|---|
| 8,014,207 B2 | 9/2011 | Ryu et al. |
| 8,873,286 B2 * | 10/2014 | Strasser et al. ............ 365/185.03 |
| 8,898,543 B2 * | 11/2014 | Jo et al. ......................... 714/764 |
| 8,924,774 B2 * | 12/2014 | Um et al. ........................ 714/6.1 |
| 8,976,598 B2 * | 3/2015 | Kim .......................... 365/185.22 |
| 9,009,390 B2 * | 4/2015 | Choi et al. ...................... 711/103 |
| 2005/0078519 A1 * | 4/2005 | Shiga ........................ 365/185.17 |
| 2012/0268994 A1 | 10/2012 | Nagashima |

FOREIGN PATENT DOCUMENTS

| | | |
|---|---|---|
| JP | 2008-269769 | 11/2008 |
| JP | 2010-170685 | 8/2010 |
| JP | 2011-100519 | 5/2011 |
| JP | 2012-203957 A | 10/2012 |

* cited by examiner

NONVOLATILE SEMICONDUCTOR MEMORY DEVICE AND READ METHOD THEREOF

CROSS-REFERENCE TO RELATED APPLICATIONS

This application is based upon and claims the benefit of priority from the prior Japanese Patent Application No. 2013-46070, filed on Mar. 8, 2013, the entire contents of which are incorporated herein by reference.

FIELD

Embodiments relate to an electrically rewritable nonvolatile semiconductor memory device and a read method thereof.

BACKGROUND

In recent years, along with miniaturization and increasing capacity of NAND type flash memory, a margin between threshold distributions of a memory cell has narrowed. Furthermore, repeating an erase operation (Erase) and a write operation (Program) on a memory cell holding ordinary data causes a threshold voltage distribution of that memory cell to deviate from an initial state, with the result that read by an optimal setting of a read voltage becomes difficult. In contrast, the erase operation and the write operation are never repeatedly executed on a memory cell holding initial setting data. However, the erase operation and the write operation on the memory cell holding ordinary data have an effect also on the threshold voltage of the memory cell holding initial setting data. As a result, read by an optimal setting of a read voltage becomes difficult also for the memory cell holding initial setting data.

DETAILED DESCRIPTION

A nonvolatile semiconductor memory device according to an embodiment includes a memory cell array and a control circuit. The memory cell array comprises a plurality of memory cells and stores initial setting data in the plurality of memory cells. The control circuit is configured to apply a first voltage to gates of the plurality of memory cells to read the initial setting data and, depending on that read result, apply a second voltage different from the first voltage to the gates of the plurality of memory cells to read the initial setting data.

Next, a nonvolatile semiconductor memory device according to embodiments will be described with reference to the drawings.

First Embodiment

Figure 1:
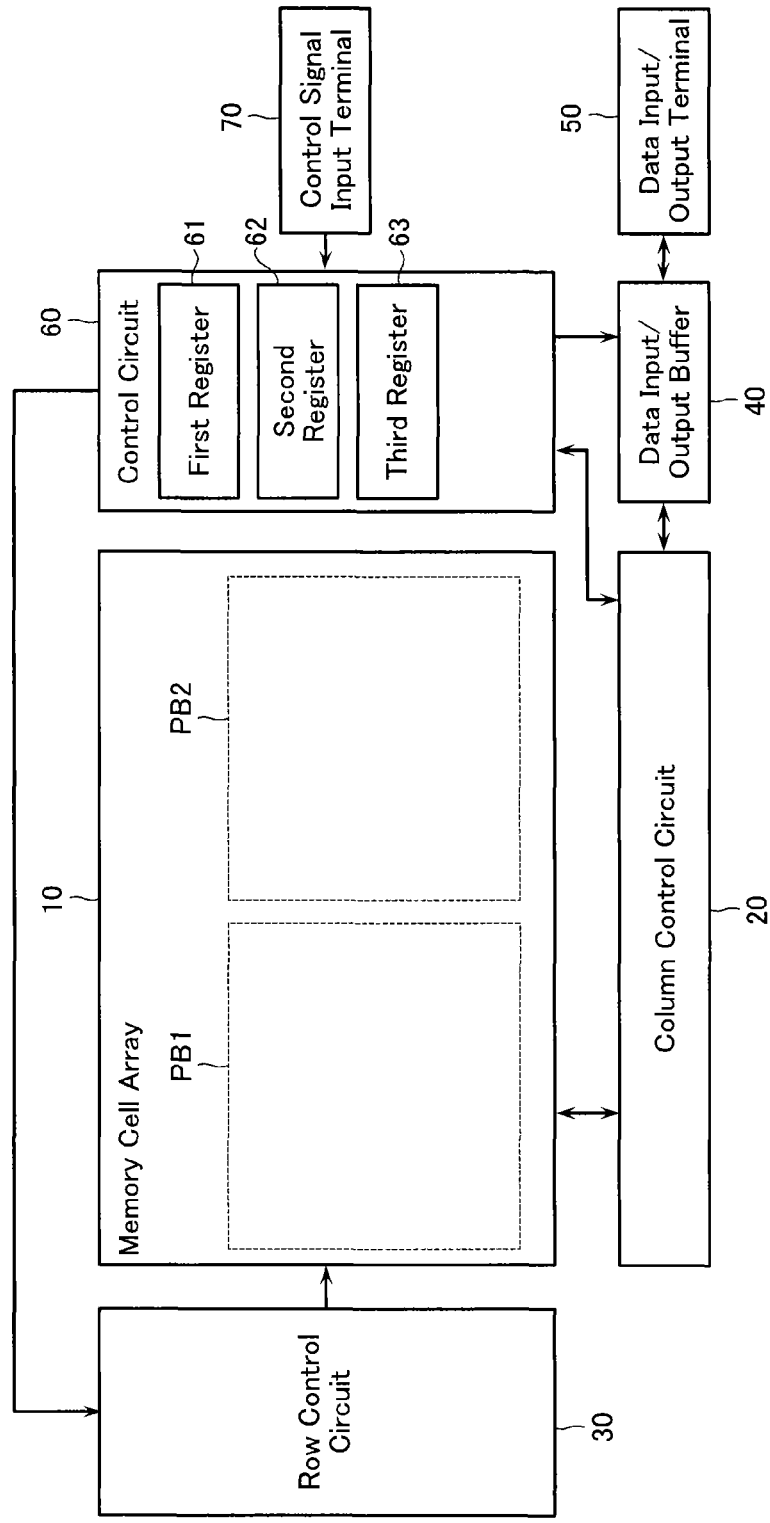
FIG. 1 is an example of a block diagram showing a schematic configuration of a nonvolatile semiconductor memory device (NAND cell type flash memory) according to a first embodiment.

FIG. 1 shows an example of configuration of a nonvolatile semiconductor memory device (NAND cell type flash memory) according to a first embodiment. This nonvolatile semiconductor memory device comprises a memory cell array 10 configured having memory cells arranged in a matrix therein, each of the memory cells storing data in a nonvolatile manner.

Figure 2:
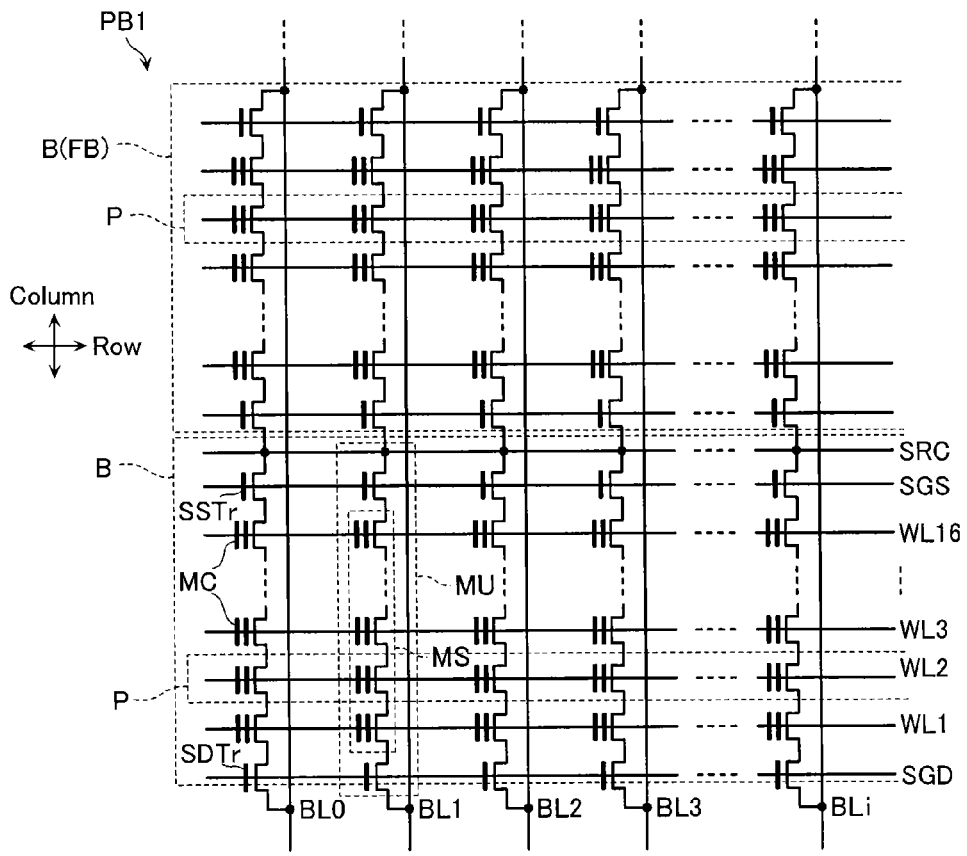
FIG. 2 is an example of a circuit diagram showing a plane PB1 according to the first embodiment.

As shown in FIG. 1, the memory cell array 10 includes two planes PB1 and PB2. Note that the number of planes is not limited to two, and may be three or more. FIG. 2 shows an example of configuration of the plane PB1.

As shown in FIG. 2, the plane PB1 is configured by a plurality of blocks B. In the plane PB1, data is erased in units of this block B (block erase processing).

As shown in FIG. 2, the block B includes a plurality of memory units MU. One memory unit MU is configured by: a memory string MS that is configured from, for example, 16 memory cells MC connected in series; and a drain side select transistor SDTr and source side select transistor SSTr that are connected to the two ends of the memory string MS. One end of the drain side select transistor SDTr is connected to any of bit lines BL0~BLi, and one end of the source side select transistor SSTr is commonly connected to a source line SRC. Control gates of the memory cells MC disposed in a line in a row direction are commonly connected to one of word lines WL1~WL16. Moreover, control gates of the drain side select transistors SDTr disposed in a line in the row direction are commonly connected to a drain side select gate line SGD, and control gates of the source side select transistors SSTr disposed in a line in the row direction are commonly connected to a source side select gate line SGS.

A group of the plurality of memory cells MC connected to one word line WL configures one page P. Data is written and read on the basis of this page P.

In addition, at least one of the plurality of blocks B is employed as a ROM fuse block FB. The ROM fuse block FB stores initial setting data and inverted data of the initial setting data. Read of the initial setting data (power-on read) is executed immediately after power-on of the nonvolatile semiconductor memory device. The initial setting data includes, for example, a defective column address, a parameter, and a defective block address, and is employed in initial setting of the memory cell array 10 after power-on. A head parameter included in the parameters includes information for determining whether the ROM fuse block FB is damaged or not. The parameter includes information of a write voltage, a read voltage, a write pass voltage, a read pass voltage, and so on.

The plane PB1 was described above, but the plane PB2 also has a similar configuration to that of the plane PB1. Therefore, the ROM fuse block FB is provided also in the plane PB2. The ROM fuse block FB provided in the plane PB2 also stores the initial setting data (defective column address, parameter, and defective block address) and the inverted data of the initial setting data.

The configuration of the nonvolatile semiconductor memory device is again described with reference to FIG. 1. As shown in FIG. 1, connected to the memory cell array 10 are a column control circuit 20 for controlling a voltage of the bit line BL, and a row control circuit 30 for controlling a voltage of the word line WL. The column control circuit 20 selects the bit line BL based on a column address. In addition, the column control circuit 20 reads data of the memory cell MC via the selected bit line BL. The row control circuit 30 selects the word line WL based on a row address, and applies to the word line WL various kinds of voltages such as the write voltage, the read voltage, the write pass voltage, the read pass voltage, and so on.

A data input/output buffer 40 is connected to the column control circuit 20. The data input/output buffer 40 temporarily holds data read via the column control circuit 20. In addition, the data input/output buffer temporarily holds data provided from a data input/output terminal 50.

The column control circuit 20, the row control circuit 30, and the data input/output buffer 40 are connected to a control circuit 60. The control circuit 60 generates a control signal for controlling the column control circuit 20, the row control circuit 30, and the data input/output buffer 40, in accordance with a control signal inputted to a control signal input terminal 70. Moreover, the control circuit 60 includes first through third registers 61~63 for storing the initial setting data. Specifically, the first register 61 stores the head parameter. The second register 62 stores the defective column address. The third register 63 stores the parameter.

Next, a complementary check employed when determining an error of the initial setting data will be described with reference to FIG. 3. The complementary check is an operation for determining whether or not the initial setting data that has been read has a value obtained by inverting the inverted data that has been read. The complementary check is executed by a complementary check circuit in the control circuit 60 (not shown).

Figure 3:
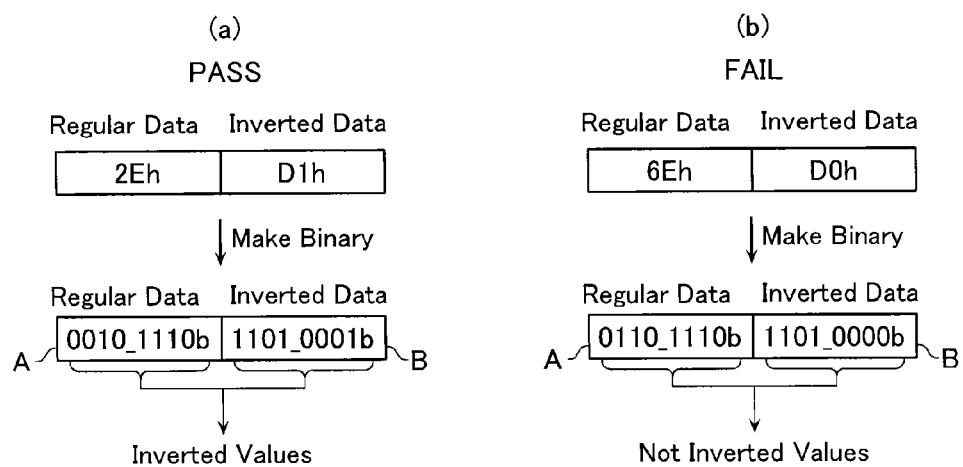
FIG. 3 is an example of a view showing a method for determining an error (complementary check) of initial setting data according to the first embodiment.

In the example shown in FIG. 3, one piece of the initial setting data (regular data) A and one piece of the inverted data B are each configured by one byte of data. In the example shown in "a" of FIG. 3, each bit of binary initial setting data (regular data) A has a value obtained by inverting each bit of binary inverted data B, whereby it is determined there is no error in the initial setting data. On the other hand, in the example shown in "b" of FIG. 3, a first bit and a seventh bit of the initial setting data (regular data) A each do not have values obtained by inverting a first bit and a seventh bit of the inverted data B, whereby it is determined there is an error in the initial setting data.

Figure 4:
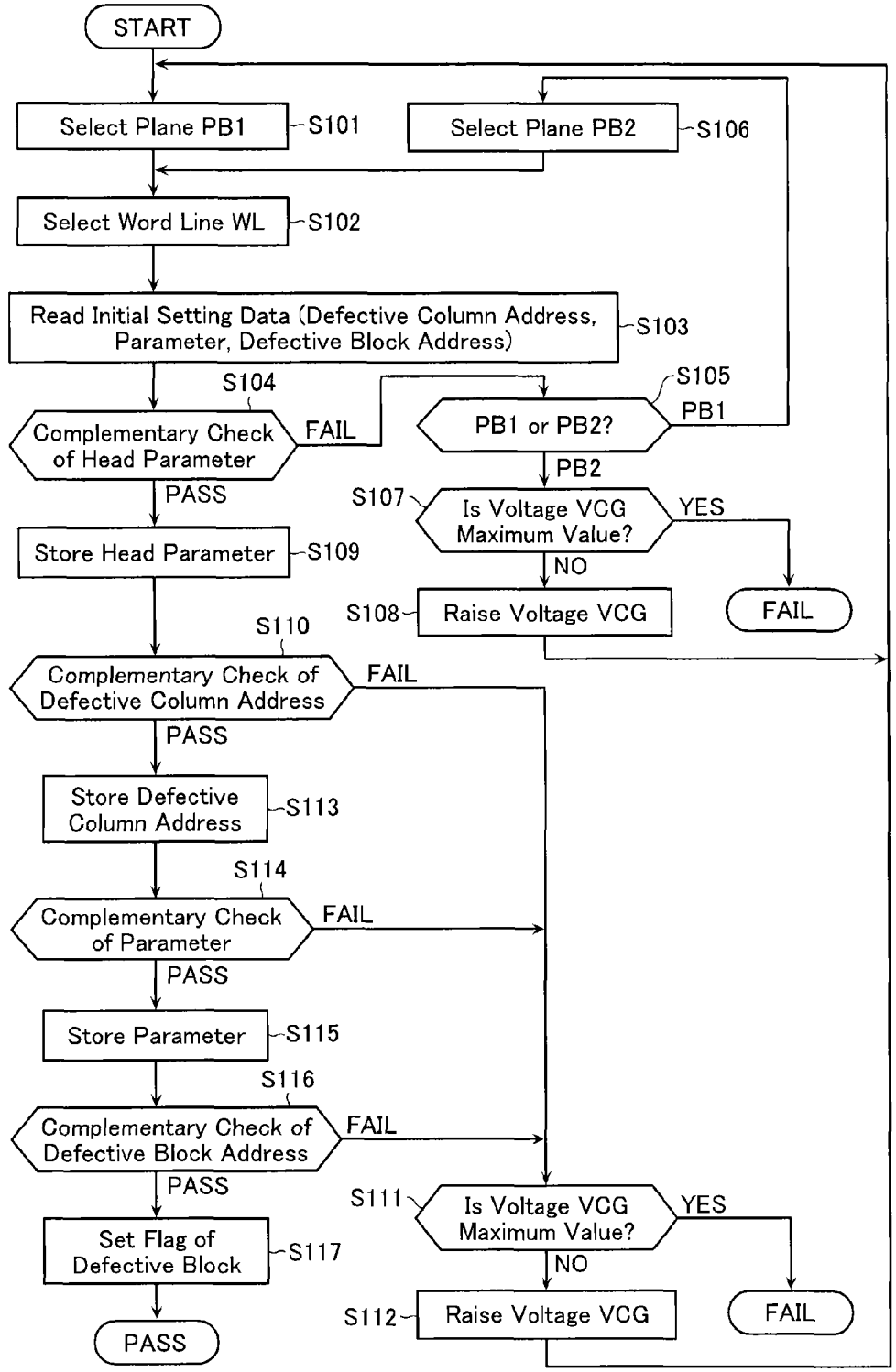
FIG. 4 is an example of a flowchart showing a read operation of the initial setting data according to the first embodiment.

Next, an outline of a read operation of the initial setting data according to the first embodiment will be described with reference to FIG. 4. As shown in FIG. 4, in steps S101~S109, the control circuit 60, first, reads the initial setting data from the ROM fuse block FB in the plane PB1. The initial setting data read here includes the defective column address, the parameter, and the defective block address. Next, if there is an error in the head parameter included in the parameters read from the plane PB1, the control circuit 60 reads the initial setting data from the ROM fuse block FB in the plane PB2. Then, if there is an error also in the head parameter read from the plane PB2, the control circuit 60 raises a read voltage VCG to again read the initial setting data from the ROM fuse block FB in the plane PB1. Now, the read voltage VCG is a voltage applied to the word line WL in the ROM fuse block FB during read of the initial setting data. In steps S101~S108, processing as described above is repeatedly executed.

In steps S110~S117 that follow, if there is an error in the read defective column address, parameter, and defective block address, the control circuit 60 raises the read voltage VCG to again read the initial setting data.

Next, steps S101~S117 are described specifically with reference to FIG. 4. First, the control circuit selects the plane PB1 (S101). Next, the control circuit 60 selects the word line WL employed in read of the initial setting data and the inverted data of the initial setting data (S102). Following this, the control circuit 60 applies the read voltage VCG to the word line WL to read the initial setting data and the inverted data of the initial setting data from the ROM fuse block FB (S103). The initial setting data read by this step S103 includes the defective column address, the parameter, and the defective block address.

Following step S103, the control circuit 60 executes the complementary check of the head parameter (S104). If it is determined by step S104 that there is an error in the head parameter (S104, FAIL), the control circuit 60 determines whether a read target of the current initial setting data was the plane PB1 or the plane PB2 (S105). If the read target of the initial setting data was the plane PB1 (S105, PB1), the control circuit 60 selects the plane PB2 (S106) and re-executes step S102.

On the other hand, if in step S105 the read target of the initial setting data was the plane PB2 (S105, PB2), the control circuit 60 determines whether the read voltage VCG is a maximum value or not (S107). Now, if it is determined that the read voltage VCG is a maximum value (S107, YES), the control circuit 60 determines read of the initial setting data to be a fail (FAIL). On the other hand, if it is determined that the read voltage VCG is not a maximum value (S107, NO), the control circuit 60 raises the read voltage VCG (S108) and again executes step S101.

If it is determined by step S104 that there is no error in the head parameter and that the ROM fuse block FB is therefore undamaged (S104, PASS), the control circuit 60 stores the head parameter in the first register (S109). Following this, the control circuit 60 executes the complementary check of the defective column address (S110).

If it is determined by step S110 that there is an error in the defective column address (S110, FAIL), the control circuit 60 determines whether the read voltage VCG is a maximum value or not (S111). Now, if it is determined that the read voltage VCG is a maximum value (S111, YES), the control circuit 60 determines read of the initial setting data to be a fail (FAIL). On the other hand, if it is determined that the read voltage VCG is not a maximum value (S111, NO), the control circuit 60 raises the read voltage VCG (S112) and again executes step S101.

If it is determined by step S110 that there is no error in the defective column address (S110, PASS), the control circuit 60 stores the defective column address in the second register 62 (S113).

Next, the control circuit 60 executes the complementary check of the parameter (S114). If it is determined by step S114 that there is an error in the parameter (S114, FAIL), step S111 is executed. On the other hand, if it is determined by step S114 that there is no error in the parameter (S114, PASS), the control circuit 60 stores the parameter in the third register (S115).

Following this, the control circuit 60 executes the complementary check of the defective block address (S116). If it is determined by step S116 that there is an error in the defective block address (S116, FAIL), step S111 is executed. On the other hand, if it is determined by step S116 that there is no error in the defective block address (S116, PASS), the control circuit 60 accesses a defective block based on the defective block address and sets a flag of that defective block in a bad block flag register corresponding to the defective block (S117).

Figure 5:
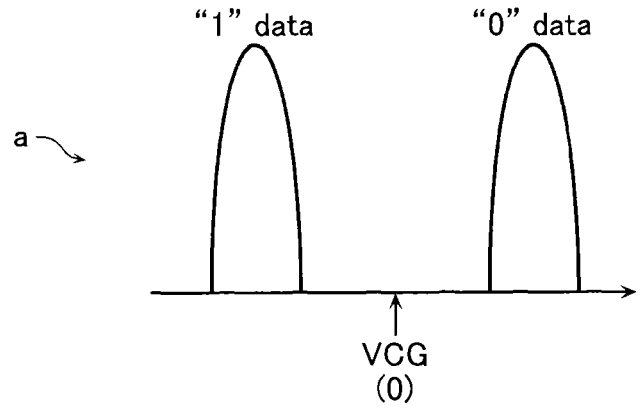
FIG. 5 is an example of a view showing an advantage due to the first embodiment.
Figure 5:
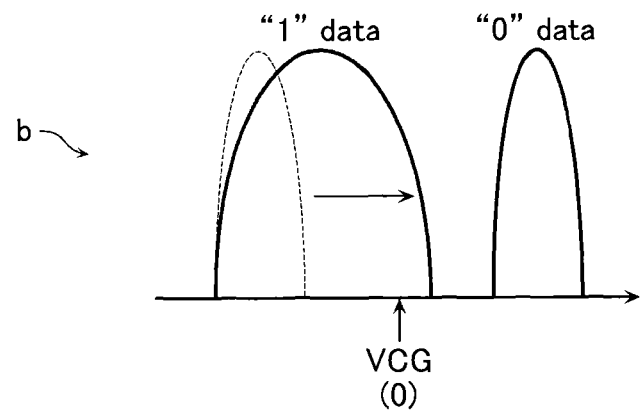
Figure 5:
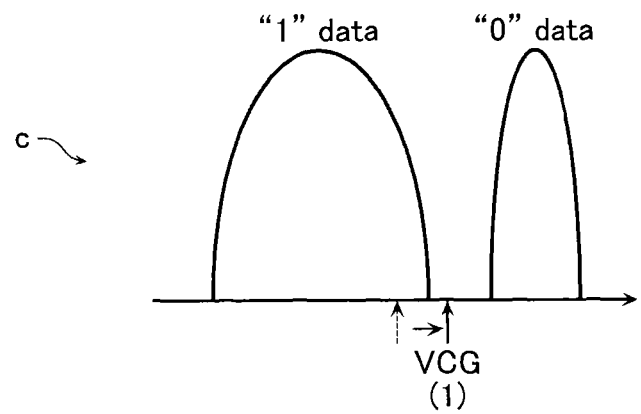

Next, advantages due to the first embodiment are described with reference to FIG. 5. Shown in "a" of FIG. 5 is a threshold voltage distribution of the memory cell MC immediately after storing the initial setting data (immediately after shipment). Shown in "b" of FIG. 5 is a threshold voltage distribution of the memory cell MC after a certain time has passed from a state shown in "a" of FIG. 5. Note that FIG. 5 shows an example where the memory cell MC is configured capable of storing binary data.

In "a" of FIG. 5, a read voltage VCG(0) is set between threshold voltage distributions indicating "1" data and "0" data, whereby an accurate read operation of the initial setting data can be executed. In "b" of FIG. 5, an upper end of the threshold voltage distribution indicating "1" data extends more greatly to a high voltage side than the read voltage VCG(0). For example, this extending of the threshold voltage distribution of the initial setting data is caused by effects of the erase operation and the write operation on memory cells holding ordinary data. Therefore, if, in "b" of FIG. 5, the initial setting data is read by the same read voltage VCG(0) as in the state of "a" of FIG. 5, a mistaken read results. Accordingly, in the present embodiment, the read voltage VCG is raised depending on a read result of the initial setting data (defective column address, parameter, and defective block address) (S108 and S112). For example, as shown in "c" of FIG. 5, the read voltage VCG is gradually raised to the read voltage VCG(1). As a result, the present embodiment can handle a change in the threshold voltage distribution to accurately read the initial setting data.

Second Embodiment

Next, a nonvolatile semiconductor memory device according to a second embodiment will be described. The second embodiment, while having a similar configuration to that of the first embodiment, executes a different read operation of the initial setting data to that of the first embodiment. Therefore, an example of the read operation of the initial setting data according to the second embodiment will be described below with reference to FIG. 6.

Figure 6:
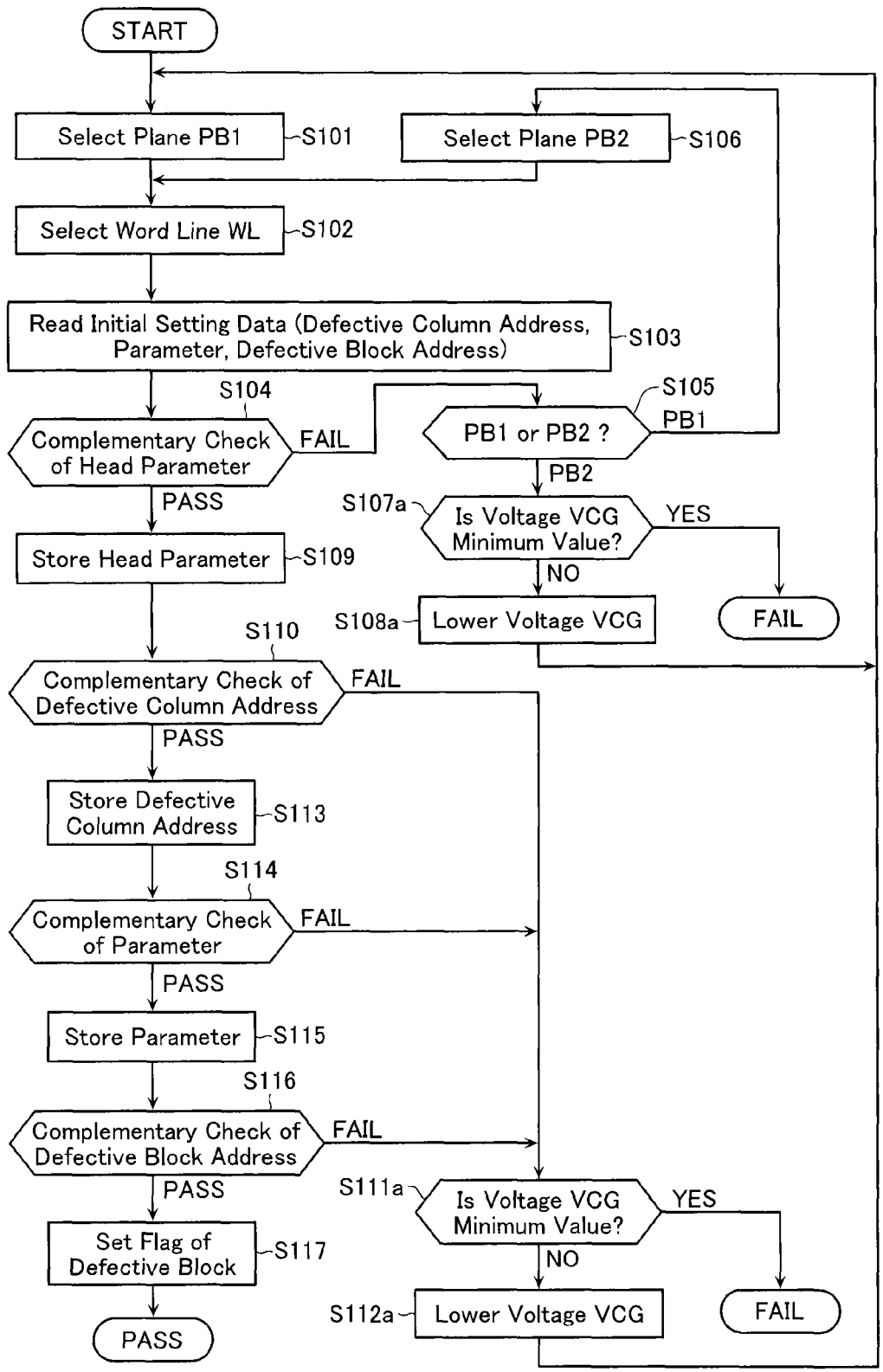
FIG. 6 is an example of a flowchart showing a read operation of the initial setting data according to a second embodiment.

As shown in FIG. 6, the second embodiment lowers the read voltage VCG (S108a and S112a) provided the read voltage VCG is not a minimum value (NO of S107a and NO of S111a), depending on a read result of the initial setting data (defective column address, parameter, and defective block address). The second embodiment differs from the first embodiment in this respect only.

Figure 7:
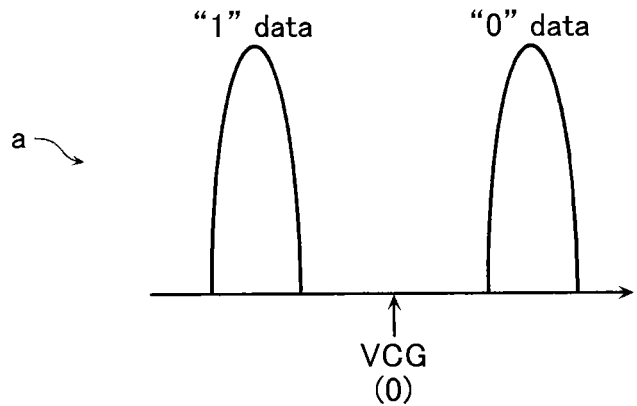
FIG. 7 is an example of a view showing an advantage due to the second embodiment.
Figure 7:
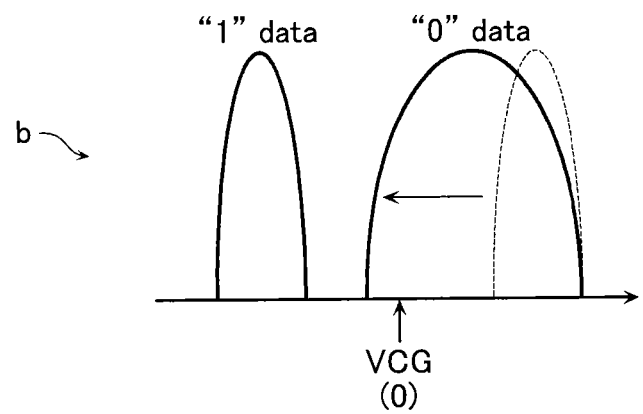
Figure 7:
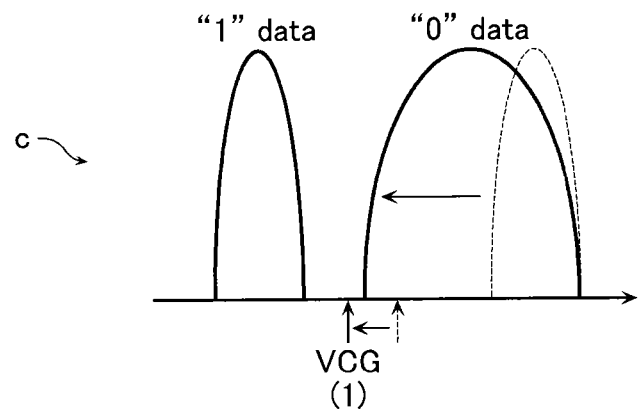

Next, advantages due to the second embodiment are described with reference to FIG. 7. Shown in "a" of FIG. 7 is a threshold voltage distribution of the memory cell MC immediately after storing the initial setting data. Shown in "b" of FIG. 7 is a threshold voltage distribution of the memory cell MC after a certain time has passed from a state shown in "a" of FIG. 7. Note that FIG. 7 shows an example where the memory cell MC is configured capable of storing binary data.

In "a" of FIG. 7, a read voltage VCG(0) is set between threshold voltage distributions indicating "1" data and "0" data, whereby an accurate read operation of the initial setting data can be executed. In "b" of FIG. 7, a lower end of the threshold voltage distribution indicating "0" data extends more greatly to a low voltage side than the read voltage VCG(0). For example, this extending of the threshold voltage distribution of the initial setting data is caused by effects of the erase operation and the write operation on memory cells holding ordinary data. Therefore, if, in "b" of FIG. 7, the initial setting data is read by the same read voltage VCG(0) as in the state of "a" of FIG. 7, a mistaken read results. Accordingly, in the present embodiment, the read voltage VCG is lowered depending on a read result of the initial setting data (defective column address, parameter, and defective block address) (S108a and S112a). For example, as shown in "c" of FIG. 7, the read voltage VCG is gradually lowered to the read voltage VCG(1). As a result, the present embodiment can handle a change in the threshold voltage distribution to accurately read the initial setting data.

Third Embodiment

Next, a nonvolatile semiconductor memory device according to a third embodiment will be described. The third embodiment, while having a similar configuration to that of the first embodiment, executes a different read operation of the initial setting data to that of the first embodiment.

In the third embodiment, the control circuit 60 stores the initial setting data (defective column address, parameter, and defective block address) in half of the total number of bits configuring one page (first number). At the same time, the control circuit 60 stores the inverted data of the initial setting data in the remaining half of the bits. Therefore, provided there is no error in the initial setting data, the number of bits indicating "1" data and the number of bits indicating "0" data included in the initial setting data and the inverted data in one page are equal. That is, provided there is no error in the initial setting data, the number of bits indicating "1" data included in the initial setting data and the inverted data in one page is equal to half of the total number of bits in one page.

Therefore, if the number of bits indicating "1" data included in the initial setting data and the inverted data is too smaller than half of the total number of bits configuring one page, it is considered that the read voltage VCG is smaller than an appropriate value. Moreover, if the number of bits indicating "1" data included in the initial setting data and the inverted data is too larger than half of the total number of bits configuring one page, it is considered that the read voltage VCG is larger than an appropriate value. Accordingly, the present embodiment executes the read operation of the initial setting data below, shown in FIGS. 8A and 8B, to adjust the read voltage VCG to an appropriate value.

Figure 8A:
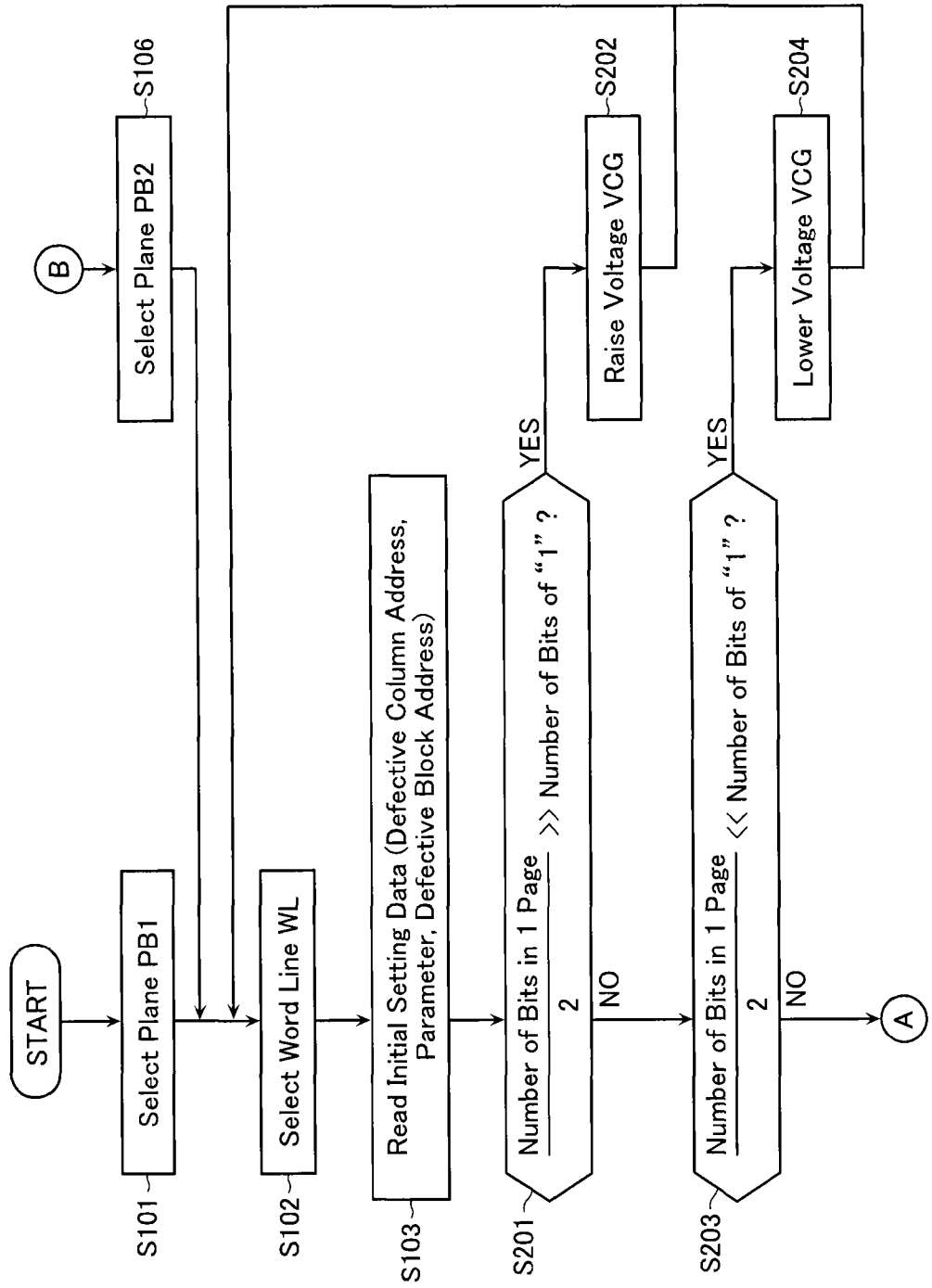
FIG. 8A is an example of a flowchart showing a read operation of the initial setting data according to a third embodiment.

As shown in FIG. 8A, in the third embodiment, the control circuit 60, first, executes similar steps S101~S103 to in the first embodiment. Following this, the control circuit 60 determines whether the number of bits indicating "1" data included in the initial setting data and the inverted data is smaller than half of the total number of bits configuring one page by an amount of a certain threshold number or not (S201). Now, if it is determined that the number of bits indicating "1" data included in the initial setting data and the inverted data is smaller than half of the total number of bits configuring one page by an amount of the certain threshold number (S201, YES), the control circuit 60 raises the read voltage VCG (S202) and again executes step S102.

On the other hand, if it is determined by step S201 that the number of bits indicating "1" data included in the initial setting data and the inverted data is not smaller than half of the total number of bits configuring one page by an amount of the certain threshold number (S201, NO), the control circuit 60 executes step S203. In step S203, it is determined whether the number of bits indicating "1" data included in the initial setting data and the inverted data is larger than half of the total number of bits configuring one page by an amount of a certain threshold number or not. Now, if it is determined that the number of bits indicating "1" data included in the initial setting data and the inverted data is larger than half of the total number of bits configuring one page by an amount of the certain threshold number (S203, YES), the control circuit 60 lowers the read voltage VCG (S204) and again executes step S102.

Figure 8B:
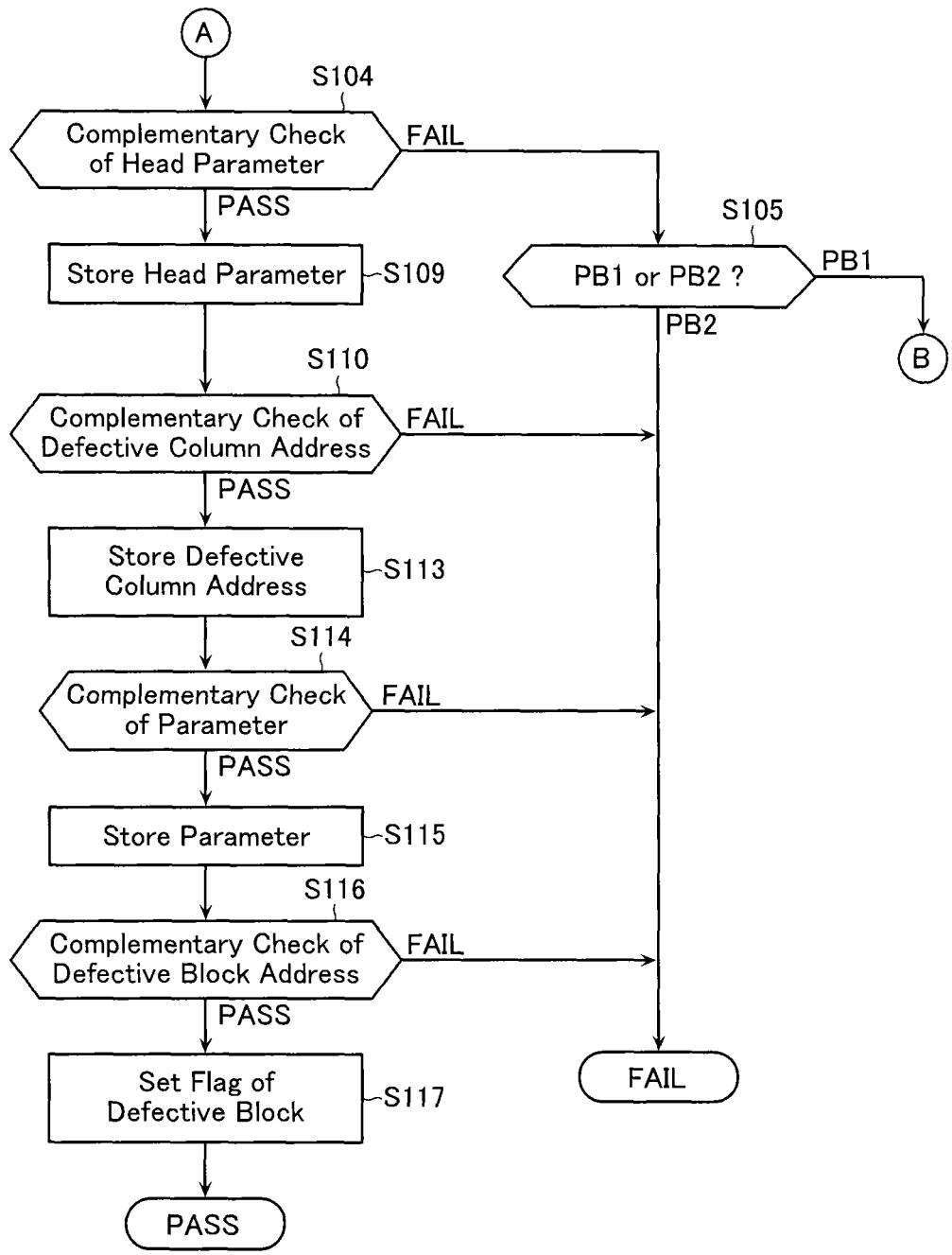
FIG. 8B is an example of a flowchart showing the read operation of the initial setting data according to the third embodiment.

On the other hand, as shown in FIGS. 8A and 8B, if it is determined by step S203 that the number of bits indicating "1" data included in the initial setting data and the inverted data is not larger than half of the total number of bits configuring one page by an amount of the certain threshold number (S203, NO), the control circuit 60 executes steps S104~S106 and S109~S117 similar to that of the first embodiment. However, in the third embodiment, if the read target of the initial setting data was the plane PB2 (S105, PB2), the control circuit 60 determines read of the initial setting data to be a fail (FAIL). Moreover, if it is determined by steps S110, S114, and S116 that there is an error in the initial setting data (defective column address, parameter, and defective block address) (S110, S114, and S116, FAIL), the control circuit 60 determines read of the initial setting data to be a fail (FAIL).

Due to the above operation, the third embodiment can adjust the read voltage VCG to an appropriate value and thereby handle a change in the threshold voltage distribution to accurately read the initial setting data.

Fourth Embodiment

Next, a nonvolatile semiconductor memory device according to a fourth embodiment will be described. Contrary to in the first embodiment, the initial setting data in the fourth embodiment includes an error correction-dedicated parity bit. This parity bit is employed to execute error correction on the initial setting data. A circuit for executing the error correction may be provided in a peripheral circuit of the memory cell array 10 or may be provided in an external controller. In other respects, the fourth embodiment has a similar configuration to that of the first embodiment.

In addition, the fourth embodiment executes a different read operation of the initial setting data to that of the first embodiment. Therefore, the read operation of the initial setting data according to the fourth embodiment will be described below with reference to FIG. 9.

Figure 9:
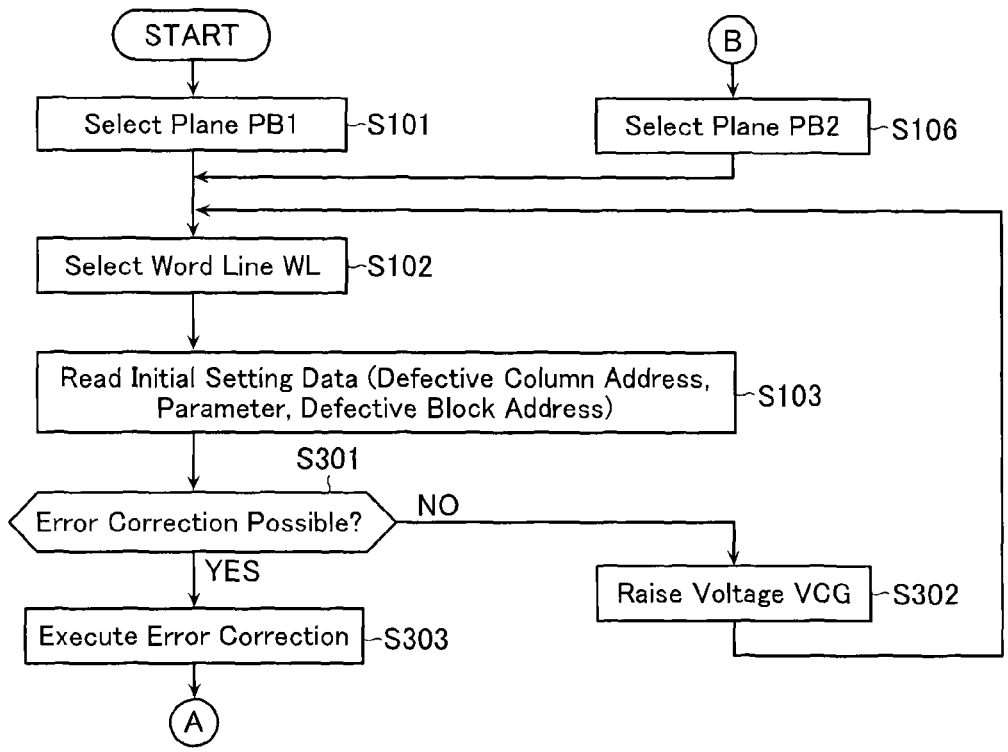
FIG. 9 is an example of a flowchart showing a read operation of the initial setting data according to a fourth embodiment.

As shown in FIG. 9, in the fourth embodiment, the control circuit 60, first, executes similar steps S101~S103 to in the first embodiment. Following this, the control circuit 60 determines whether error correction on the initial setting data can be executed or not (S301). Now, if it is determined that error correction cannot be executed (S301, NO), the control circuit 60 raises the read voltage VCG (S302) and again executes a processing of step S102. On the other hand, if it is determined that error correction can be executed (S301, YES), the control circuit 60 executes error correction on the initial setting data (S303) and then, similarly to in the third embodiment, executes steps S104~S106 and S109~S117 (refer to FIG. 8B).

Due to the above, the fourth embodiment displays similar advantages to those of the first embodiment.

Fifth Embodiment

Next, a nonvolatile semiconductor memory device according to a fifth embodiment will be described. The fifth embodiment has a similar configuration to that of the fourth embodiment. In addition, the fifth embodiment executes a different read operation of the initial setting data to that of the first embodiment. Therefore, the read operation of the initial setting data according to the fifth embodiment will be described below with reference to FIG. 10.

Figure 10:
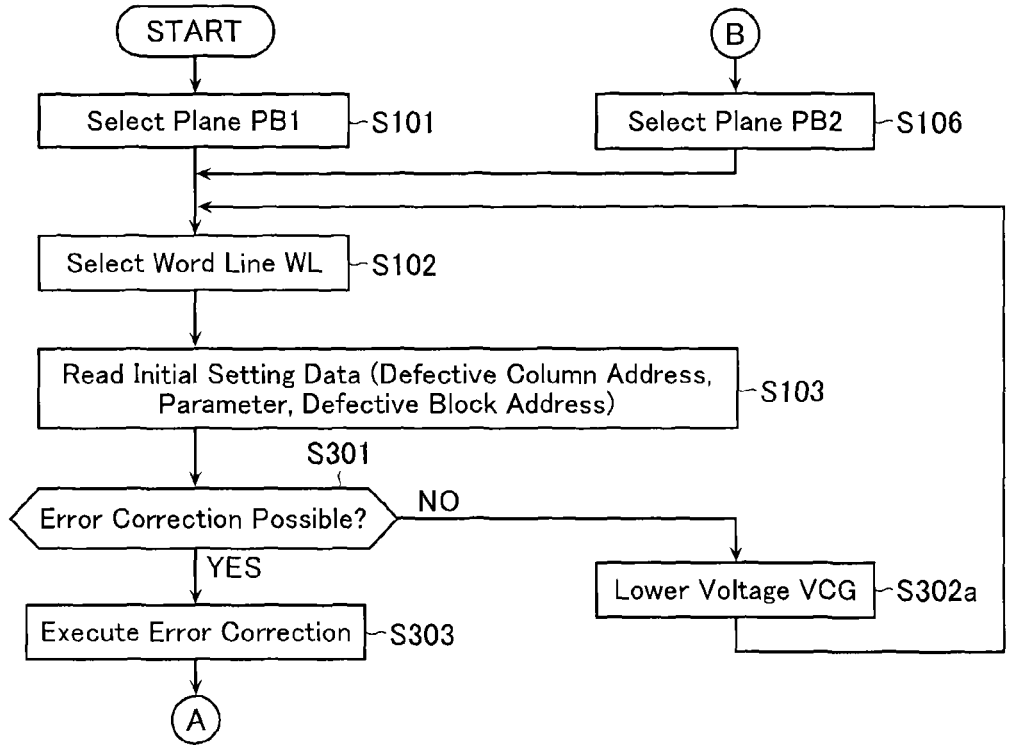
FIG. 10 is an example of a flowchart showing a read operation of the initial setting data according to a fifth embodiment.

As shown in FIG. 10, the fifth embodiment executes a substantially similar read operation of the initial setting data to that of the fourth embodiment. However, in the fifth embodiment, when it is determined that error correction cannot be executed, the read voltage VCG is lowered (S302a). The fifth embodiment differs from the fourth embodiment in this respect only. Due to the above, the fifth embodiment displays similar advantages to those of the second embodiment.

Sixth Embodiment

Figure 11:
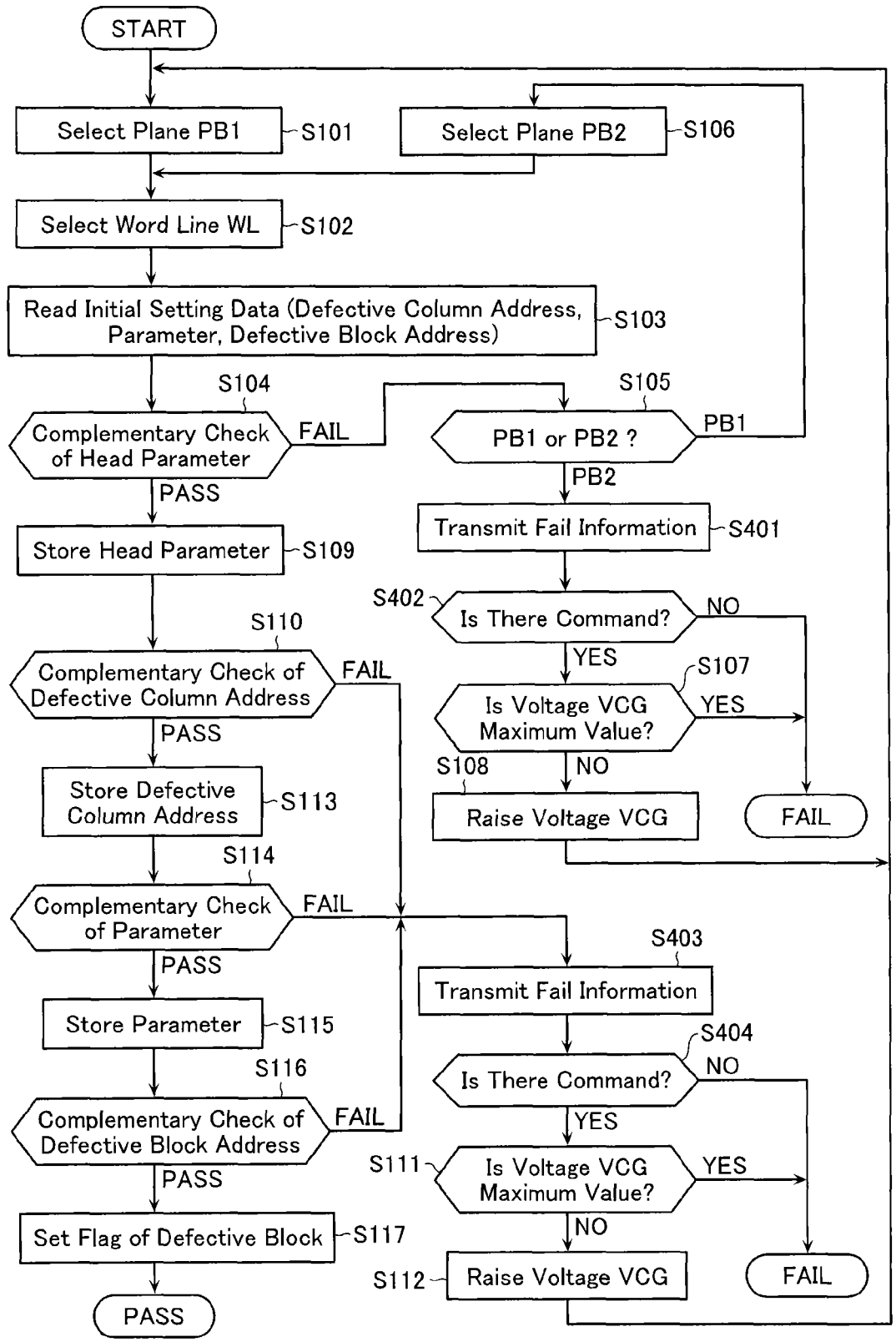
FIG. 11 is an example of a flowchart showing a read operation of the initial setting data according to a sixth embodiment.

Next, a nonvolatile semiconductor memory device according to a sixth embodiment will be described. The sixth embodiment has a similar configuration to that of the first embodiment. On the other hand, as shown in FIG. 11, the sixth embodiment, contrary to the first embodiment, raises the read voltage VCG based on a command, thereby reading the initial setting data. In other respects, the sixth embodiment executes similar processing to that of the first embodiment.

As shown in FIG. 11, in the sixth embodiment, if the read target of the initial setting data was the plane PB2 (S105, PB2), the control circuit 60 transmits Fail information to the external controller (S401). Next, the control circuit 60 determines whether a command has been received from the external controller or not (S402). Now, if it is determined that a command has been received from the external controller (S402, YES), the control circuit 60 executes a similar step S107 to in the first embodiment. On the other hand, if it is determined that a command has not been received from the external controller (S402, NO), the control circuit 60 determines read of the initial setting data to be a fail (FAIL).

Moreover, as shown in FIG. 11, in the sixth embodiment, if it is determined that there is an error in the initial setting data (defective column address, parameter, and defective block address), similarly to in the first embodiment, (S110, S114, and S116, FAIL), the control circuit 60 transmits Fail information to the external controller (S403). Next, the control circuit 60 determines whether a command has been received from the external controller or not (S404). Now, if it is determined that a command has been received from the external controller (S404, YES), the control circuit 60 executes a similar step S111 to in the first embodiment. On the other hand, if it is determined that a command has not been received from the external controller (S404, NO), the control circuit 60 determines read of the initial setting data to be a fail (FAIL). Due to the above, the sixth embodiment displays similar advantages to those of the first embodiment. Moreover, in the sixth embodiment, the read operation of the initial setting data can be controlled by a command.

Other

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array comprising a plurality of memory cells and having initial setting data stored in the plurality of memory cells; and
   a control circuit configured to apply a first voltage to gates of the plurality of memory cells to read the initial setting data and, depending on that read result, apply a second voltage different from the first voltage to the gates of the plurality of memory cells to read the initial setting data,
   the control circuit being operative to store the initial setting data and inverted data of the initial setting data in the plurality of memory cells,
   depending on whether or not the initial setting data that has been read has a value obtained by inverting the inverted data that has been read, the control circuit being operative to change a voltage applied to the gates of the plurality of memory cells to read the initial setting data, and
   depending on a read result of the initial setting data, the control circuit being operative to increase the voltage applied to the gates of the plurality of memory cells.

2. A nonvolatile semiconductor memory device, comprising:
   a memory cell array comprising a plurality of memory cells and having initial setting data stored in the plurality of memory cells; and
   a control circuit configured to apply a first voltage to gates of the plurality of memory cells to read the initial setting data and, depending on that read result, apply a second voltage different from the first voltage to the gates of the plurality of memory cells to read the initial setting data,
   the control circuit being configured to store the initial setting data and inverted data of the initial setting data in the plurality of memory cells, and
   depending on whether or not the initial setting data that has been read has a value obtained by inverting the inverted data that has been read, the control circuit being operative to change a voltage applied to the gates of the plurality of memory cells to read the initial setting data.

3. The nonvolatile semiconductor memory device according to claim 2, wherein
   depending on a read result of the initial setting data, the control circuit being operative to increase the voltage applied to the gates of the plurality of memory cells.

4. The nonvolatile semiconductor memory device according to claim 3, wherein
   the control circuit, depending on whether the voltage applied to the gates of the plurality of memory cells has a maximum value or not, increases the voltage applied to the gates of the plurality of memory cells.

5. The nonvolatile semiconductor memory device according to claim 2, wherein
   the control circuit, depending on a read result of the initial setting data, decreases the voltage applied to the gates of the plurality of memory cells.

6. The nonvolatile semiconductor memory device according to claim 5, wherein
   the control circuit, depending on whether the voltage applied to the gates of the plurality of memory cells has a minimum value or not, decreases the voltage applied to the gates of the plurality of memory cells.

7. The nonvolatile semiconductor memory device according to claim 2, wherein
   the control circuit stores the initial setting data and inverted data of the initial setting data in the plurality of memory cells,
   the control circuit, when it has been determined that the number of bits indicating first data included in the initial setting data and the inverted data is smaller than a first threshold number, increases the voltage applied to the gates of the plurality of memory cells to read the initial setting data, and
   the control circuit, when it has been determined that the number of bits indicating the first data included in the initial setting data and the inverted data is larger than a second threshold number, decreases the voltage applied to the gates of the plurality of memory cells to read the initial setting data.

8. The nonvolatile semiconductor memory device according to claim 2, wherein
   the control circuit, when it has been determined that error correction cannot be executed on the initial setting data, changes the voltage applied to the gates of the plurality of memory cells to read the initial setting data.

9. The nonvolatile semiconductor memory device according to claim 2, wherein
   the control circuit, when it has been determined that error correction cannot be executed on the initial setting data, increases the voltage applied to the gates of the plurality of memory cells to read the initial setting data.

10. The nonvolatile semiconductor memory device according to claim 2, wherein
    the control circuit, when it has been determined that error correction cannot be executed on the initial setting data, decreases the voltage applied to the gates of the plurality of memory cells to read the initial setting data.

11. The nonvolatile semiconductor memory device according to claim 2, wherein
    the control circuit changes the voltage applied to the gates of the plurality of memory cells to read the initial setting data, based on a command from a controller.

12. A method of reading a nonvolatile semiconductor memory device, the nonvolatile semiconductor memory device comprising a memory cell array that comprises a plurality of memory cells and has initial setting data stored in the plurality of memory cells, the method comprising:
    applying a first voltage to gates of the plurality of memory cells to read the initial setting data and, depending on that read result, and applying a second voltage different from the first voltage to the gates of the plurality of memory cells to read the initial setting data,
    the initial setting data and inverted data of the initial setting data being stored in the plurality of memory cells; and
    depending on whether or not the initial setting data that has been read has a value obtained by inverting the inverted data that has been read, voltage applied to the gates of the plurality of memory cells being changed to read the initial setting data.

13. The method of reading a nonvolatile semiconductor memory device according to claim 12, further comprising:
    depending on a read result of the initial setting data, increasing the voltage applied to the gates of the plurality of memory cells.

14. The method of reading a nonvolatile semiconductor memory device according to claim 12, further comprising:
    depending on a read result of the initial setting data, decreasing the voltage applied to the gates of the plurality of memory cells.

15. The method of reading a nonvolatile semiconductor memory device according to claim 12, further comprising:
   storing the initial setting data and inverted data of the initial setting data in the plurality of memory cells;
   when it has been determined that the number of bits indicating first data included in the initial setting data and the inverted data is smaller than a first threshold number, increasing the voltage applied to the gates of the plurality of memory cells to read the initial setting data; and
   when it has been determined that the number of bits indicating the first data included in the initial setting data and the inverted data is larger than a second threshold number,
   decreasing the voltage applied to the gates of the plurality of memory cells to read the initial setting data.

16. The method of reading a nonvolatile semiconductor memory device according to claim 12, further comprising:
   when it has been determined that error correction cannot be executed on the initial setting data, changing the voltage applied to the gates of the plurality of memory cells to read the initial setting data.

17. The method of reading a nonvolatile semiconductor memory device according to claim 12, further comprising:
   based on a command from a controller, changing the voltage applied to the gates of the plurality of memory cells to read the initial setting data.

* * * * *